(12) United States Patent
Sunwoo et al.

(10) Patent No.: US 7,459,993 B2
(45) Date of Patent: Dec. 2, 2008

(54) RESONATOR, BAND-PASS FILTER, AND DUPLEXER

(75) Inventors: Kook-hyun Sunwoo, Hwaseong-si (KR); Yong-su Kim, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 150 days.

(21) Appl. No.: 11/647,389

(22) Filed: Dec. 29, 2006

(65) Prior Publication Data

US 2007/0159270 A1    Jul. 12, 2007

(30) Foreign Application Priority Data

Jan. 12, 2006    (KR) .................. 10-2006-0003490

(51) Int. Cl.
*H01P 5/12*    (2006.01)
*H01P 7/00*    (2006.01)

(52) U.S. Cl. .................. 333/134; 333/219.2; 333/132; 333/235; 333/188

(58) Field of Classification Search ......... 333/132–134, 333/219.2, 188
See application file for complete search history.

(56) References Cited

U.S. PATENT DOCUMENTS 6,104,275 A * 8/2000 Maeda .................. 338/32 R
6,348,846 B1 * 2/2002 von Gutfeld et al. ......... 333/201
6,498,549 B1 * 12/2002 Jiang et al. .................. 333/202
6,501,971 B1 * 12/2002 Wolf et al. .................. 505/210
7,307,818 B1 * 12/2007 Park et al. ................. 360/324.1
2002/0038989 A1 * 4/2002 Larson ........................ 310/330
2005/0023938 A1 * 2/2005 Sato et al. .................. 310/363
2007/0242395 A1 * 10/2007 Bailey ..................... 360/324.2

* cited by examiner

*Primary Examiner*—Barbara Summons
(74) *Attorney, Agent, or Firm*—Sughrue Mion, PLLC

(57) ABSTRACT

A resonator, a band-pass filter, and a duplexer are provided. In the resonator, a first electrode is formed of a nonmagnetic conductive material. A ferromagnetic fixed layer is disposed on the first electrode and has a magnetization direction which is fixed. A nonmagnetic conductive layer is disposed on the ferromagnetic fixed layer. A ferromagnetic free layer is disposed on the nonmagnetic conductive layer and has a magnetization direction which varies depending on an external magnetic field. A second electrode is disposed on the ferromagnetic free layer and comprises a nonmagnetic conductive material. The band-pass filter and the duplexer are configured using the resonator. The band-pass filter and the duplexer can operate in a high-frequency range and be miniaturized. The bandwidth of the band-pass filter and the duplexer can be adjusted and the band-pass filter and the duplexer can be formed in one body with an integrated circuit.

39 Claims, 9 Drawing Sheets

RESONATOR, BAND-PASS FILTER, AND DUPLEXER

CROSS-REFERENCE TO RELATED PATENT APPLICATION

This application claims priority from Korean Patent Application No. 10-2006-0003490, filed on Jan. 12, 2006, in the Korean Intellectual Property Office, the disclosure of which is incorporated herein in its entirety by reference.

BACKGROUND OF THE INVENTION

1. Field of the Invention

Apparatuses consistent with the present invention relate to wireless communication elements for mobile communication devices, and more particularly, to ultrahigh-frequency resonators, band-pass filters, and duplexers for mobile communication devices.

2. Description of the Related Art

With the trend of miniaturization and high functionality of mobile communication terminals, the technology for manufacturing high-frequency components for mobile communication terminals has been rapidly developed. A filter is a core component of a high-frequency mobile communication device. This filter is used to select a desired signal or to filter a specific signal among many sky-wave signals. As the frequency band of the mobile communication terminal increases, the need for an ultrahigh-frequency device increases. However, when an ultrahigh-frequency device is used in a mobile communication terminal, it is difficult to miniaturize and manufacture the mobile communication terminal with low costs. For example, an ultrahigh-frequency resonator (or filter) operating at a frequency of 2 GHz or more is too large to be integrated using a dielectric resonator such as a related art coaxial ceramic resonator. A surface acoustic wave (SAW) resonator is used instead of the dielectric resonator. However, the SAW resonator has high insertion loss and is difficult to integrate and miniaturize. In order to address these problems, much research has been conducted on the use of a film bulk acoustic wave resonator (FBAR) or a thin film resonator (TFR), which operates according to the thickness vibration of a piezoelectric thin film.

However, there still is need for a mobile communication device that can operate at an ultrahigh frequency of 4 GHz or more, be miniaturized and manufactured with low costs, since the related art FBAR does not satisfy such requirements.

SUMMARY OF THE INVENTION

The present invention provides a resonator that can operate in a high-frequency range and be miniaturized.

The present invention also provides a band-pass filter that can operate in a high-frequency range, can be miniaturized, can be formed in one body with an integrated circuit, and has an adjustable bandwidth.

The present invention also provides a duplexer that can operate in a high-frequency range, can be miniaturized, can be formed in one body with an integrated circuit, and has an adjustable bandwidth.

According to an aspect of the present invention, there is provided a resonator including: a first electrode formed of a nonmagnetic conductive material; a ferromagnetic fixed layer formed on the first electrode by a ferromagnetic material whose magnetization direction is fixed; a nonmagnetic conductive layer formed of a nonmagnetic conductive material on the ferromagnetic fixed layer; a ferromagnetic free layer formed on the nonmagnetic conductive layer by a ferromagnetic material whose magnetization direction varies with an external magnetic field; and a second electrode formed of a nonmagnetic conductive material on the ferromagnetic free layer.

According to another aspect of the present invention, there is provided a band-pass filter including at least two resonators with adjustable frequency, the at least two resonators comprising at least one serial resonator and at least one parallel resonator.

According to another aspect of the present invention, there is provided a duplexer including: first and second band-pass filters, each including at least two resonators with adjustable frequency; and a phase shifter.

BRIEF DESCRIPTION OF THE DRAWINGS

The above and other aspects of the present invention will become more apparent by describing in detail exemplary embodiments thereof with reference to the attached drawings, in which.

DETAILED DESCRIPTION OF EXEMPLARY EMBODIMENTS

The present invention will now be described more fully with reference to the accompanying drawings, in which exemplary embodiments of the invention are shown.

The terms defined below will be used to describe an exemplary embodiment of the present invention.

A ferromagnetic free layer is a ferromagnetic layer whose magnetization direction varies. Precession is a motion by which the direction of a magnetization vector of a ferromagnetic free layer changes continuously with time. A portion of a spin angular momentum caused by a polarized current (i.e., a flow of spin-deflected conduction electrons) generates a spin transfer torque in the ferromagnetic free layer. This spin transfer torque causes the magnetization vector of the ferromagnetic free layer to precess. A precession frequency is the frequency of a microwave created by the precession motion. The microwave is an electromagnetic wave with a frequency of about 300 MHz to 300 GHz.

Figure 1:
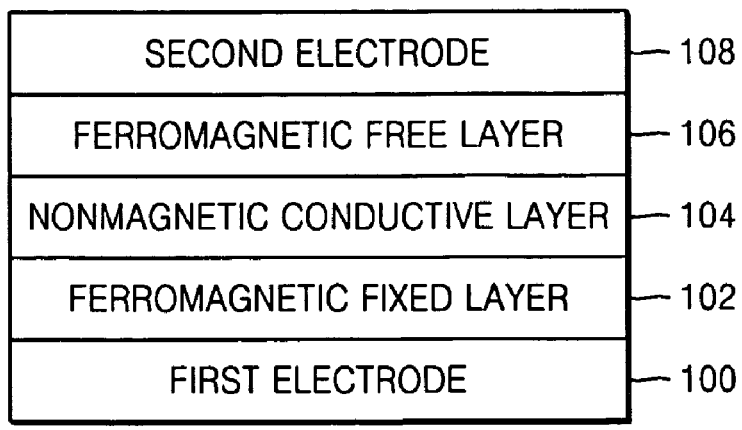
FIG. 1 is a section view of a resonator according to an exemplary embodiment of the present invention.

FIG. 1 is a sectional view of a resonator according to an exemplary embodiment of the present invention.

Referring to FIG. 1, the resonator includes a first electrode 100, a ferromagnetic fixed layer 102, a nonmagnetic conductive layer 104, a ferromagnetic free layer 106, and a second electrode 108.

The first electrode 100 is formed of a nonmagnetic conductive material.

The ferromagnetic fixed layer 102 is formed on the first electrode 100 by a ferromagnetic material whose magnetization direction is fixed.

Conduction electrons passing through the ferromagnetic fixed layer 102 are polarized in one direction by the ferromagnetic fixed layer 102. While maintaining the polarization, these polarized conduction electrons penetrate the nonmagnetic conduction layer 104 and flow into the ferromagnetic free layer 106.

Figure 2:
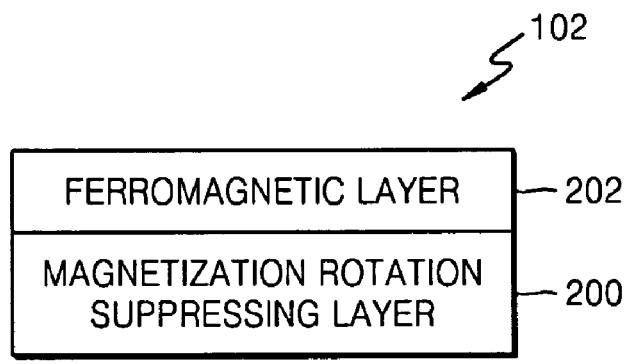
FIG. 2 is a section view of a ferromagnetic fixed layer illustrated in FIG. 1 according to an exemplary embodiment of the present invention.

FIG. 2 is a sectional view of the ferromagnetic fixed layer 102 illustrated in FIG. 1 according to an exemplary embodiment of the present invention.

Referring to FIG. 2, the ferromagnetic fixed layer 102 includes a magnetization rotation suppressing layer 200 and a ferromagnetic layer 202.

The magnetization rotation suppressing layer 200 is formed on the first electrode 100 to suppress the magnetization rotation of the ferromagnetic layer 202.

The magnetization rotation suppressing layer 200 may be formed using a compound of at least two of platinum (Pt), manganese (Mn), iridium (Ir), iron (Fe) and nickel (Ni). For example, the magnetization rotation suppressing layer 200 is formed using one of PtMn, IrMn, FeMn, and NiMn.

The ferromagnetic layer 202 is formed on the magnetization rotation suppressing layer 200 and its magnetization direction is fixed by the magnetization rotation suppressing layer 200.

The ferromagnetic layer 202 is formed using at least one of Fe, cobalt (Co) and Ni. Alternatively, the ferromagnetic layer 202 may be formed using a compound of at least two of Fe, Co and Ni.

A polarization factor of the ferromagnetic layer 202 may be changed by adjusting a composition ratio of the materials of the ferromagnetic layer 202. This polarization factor is a component function of a ferromagnetic material, and represents the characteristic of a small number of conduction electrons near the Fermi Level. The polarization factor can be expressed by Equation (1) below.

$$P = (n^+ - n^-)/(n^+ + n^-) \quad (1)$$

where $n^+$ represents the number of electrons whose spin direction agrees with that of the majority and $n-$ represents the number of electrons whose spin direction is opposed to that of the majority. For example, when the ferromagnetic layer 202 is formed of Co, the polarization factor P is 0.35. When the ferromagnetic layer 202 is formed of Ni, the polarization factor P is 0.23. When the ferromagnetic layer 202 is formed of Fe, the polarization factor P is 0.4. When the ferromagnetic layer 202 is formed of Ni and Fe at a composition ratio of 4:1, the polarization factor P is 0.3.

The precession frequency is inversely proportional to the polarization factor P.

That is, as the polarization factor decreases, the precession frequency increases. Accordingly, the precession frequency can be adjusted by adjusting the polarization factor of the ferromagnetic layer 202. The ferromagnetic layer 202 may further include a damping adjustment material for adjusting a damping constant for the precession motion of the ferromagnetic free layer 106.

Figure 3:
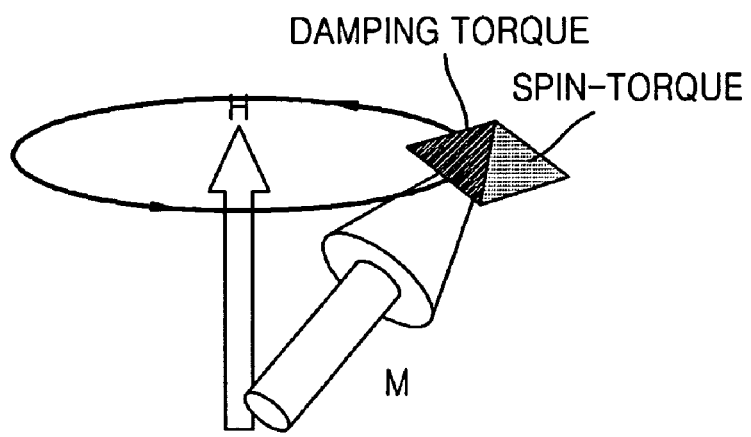
FIG. 3 illustrates an example of a damping torque caused by precession motion according to an exemplary embodiment of the present invention.

FIG. 3 illustrates an example of a damping torque caused by precession motion.

In FIG. 3, as a damping constant for the precession motion increases, a precession frequency increases.

The ferromagnetic layer 202 includes at least one of osmium (Os), niobium (Nb), ruthenium (Ru), rhodium (Rh), tantalum (Ta) and platinum (Pt) as a damping adjustment material for adjusting a damping constant. When the ferromagnetic layer 202 further includes the damping adjustment material (i.e., Os, Nb, Ru, Rh, Ta, or Pt) increasing the damping constant, the precession frequency can be increased.

Figure 4:
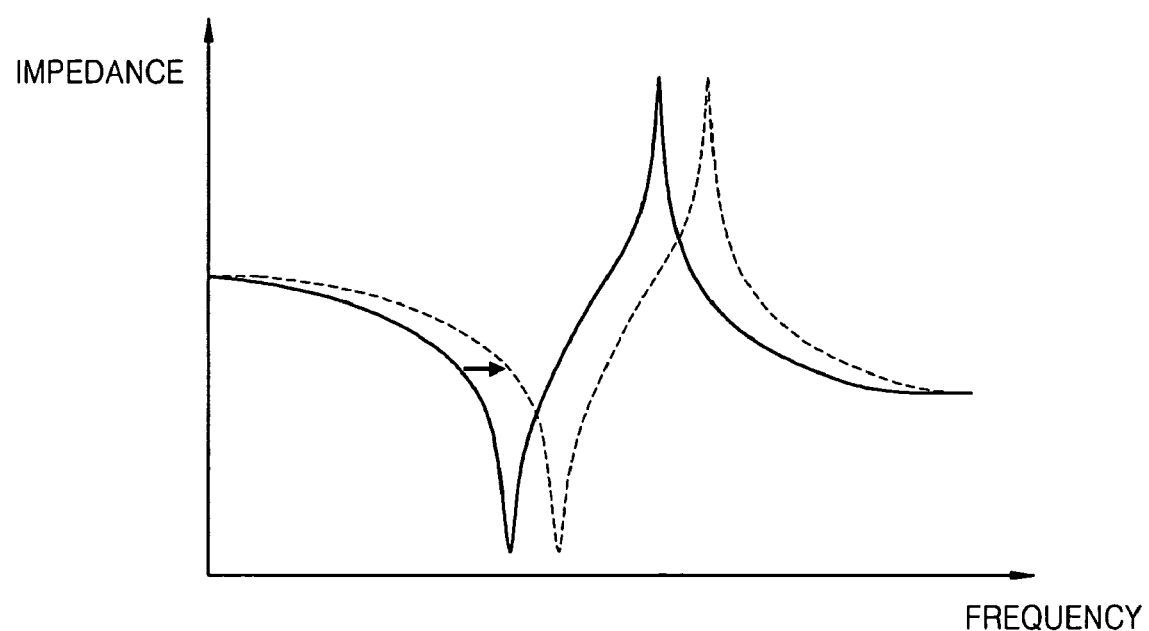
FIG. 4 is a graph illustrating the relationship between frequency and impedance in the resonator of FIG. 1, when the frequency of the resonator increases in a high-frequency direction, according to an exemplary embodiment of the present invention.

FIG. 4 is a graph illustrating the relationship between the serial/parallel frequency and the impedance of the resonator of FIG. 1 according to an exemplary embodiment of the present invention. As illustrated in FIG. 4, in order to shift the graph, the polarization factor of the ferromagnetic layer 202 may be decreased or the damping adjustment material may be further included in the ferromagnetic layer 202.

The nonmagnetic conductive layer 104 is formed on the ferromagnetic fixed layer 102 of a nonmagnetic conductive material. The nonmagnetic conductive layer 104 may be formed using a low-resistance material such as gold (Au), silver (Ag), copper (Cu), aluminum (Al), platinum (Pt), tungsten (W), ruthenium (Ru), chromium (Cr), molybdenum (Mo), rhodium (Ro), tantalum (Ta), and titanium (Ti). Alternatively, the nonmagnetic conductive layer 104 may be formed using a compound of at least two of Au, Ag, Cu, Al, Pt, W, Ru, Cr, Mo, Ro, Ta and Ti.

Since the nonmagnetic conductive layer 104 is used to suppress a ferromagnetic interaction between the ferromagnetic fixed layer 102 and the ferromagnetic free layer 106, it must have a predetermined thickness. For example, the nonmagnetic conductive layer 104 may have a thickness of about 0.1 to 2.5 nm.

The ferromagnetic free layer 106 is formed on the nonmagnetic conductive layer 104 of a ferromagnetic material whose magnetization direction varies with an external magnetic field.

Conduction electrons passing through the ferromagnetic fixed layer 102 are polarized in one direction. The polarized conduction electrons penetrate the nonmagnetic conductive layer 104 and flow into the ferromagnetic free layer 106. A portion of a spin angular momentum caused by a polarized current (i.e., a flow of the above spin-polarized conduction electrons) generates a spin transfer torque in the ferromagnetic free layer 106. This spin transfer torque causes the magnetization vector of the ferromagnetic free layer 106 to precess.

The ferromagnetic free layer 106 is formed using at least one of Fe, Co and Ni. Alternatively, the ferromagnetic free layer 106 may be formed using a compound of at least two of Fe, Co and Ni.

A polarization factor of the ferromagnetic free layer 106 may also be changed by adjusting a composition ratio of the materials forming the ferromagnetic free layer 106. For example, when the ferromagnetic free layer 106 is formed of Co, the polarization factor P is 0.35. When the ferromagnetic free layer 106 is formed of Ni, the polarization factor P is 0.23. When the ferromagnetic free layer 106 is formed of Fe, the polarization factor P is 0.4. When the ferromagnetic free layer 106 is formed using Permalloy composed of Ni and Fe at a composition ratio of 4:1, the polarization factor P is 0.3.

The precession frequency may be increased by decreasing the polarization factor of the ferromagnetic free layer 106. For example, the precession frequency is increased by adjusting the composition ratio of the ferromagnetic free layer 106 to decrease the polarization factor of the ferromagnetic free layer 106.

The ferromagnetic free layer 106 may further include a damping adjustment material for adjusting a damping constant for the precession motion of the ferromagnetic free layer 106.

In FIG. 3, as the damping constant for the precession motion increases, the precession frequency increases.

The ferromagnetic free layer 106 includes at least one of osmium (Os), niobium (Nb), ruthenium (Ru), rhodium (Rh), tantalum (Ta) and platinum (Pt) as a damping adjustment material for adjusting a damping constant. When the ferromagnetic free layer 106 further includes the damping adjustment material (i.e., Os, Nb, Ru, Rh, Ta, or Pt) increasing the damping constant, the precession frequency can be increased.

As illustrated in FIG. 4, in order to shift the graph by changing the resonance point of the resonator, the polarization factor of the ferromagnetic free layer 106 may be decreased or the damping adjustment material may be further included in the ferromagnetic free layer 106.

The second electrode 108 is formed on the ferromagnetic free layer 106 and is formed of a nonmagnetic conductive material.

The resonator illustrated in FIG. 1 is characterized in that the precession frequency of the ferromagnetic free layer 106 is adjusted according to a change in a current vertically penetrating the resonator.

An angle of the precession motion of the ferromagnetic free layer 106 changes according to the strength of a current flowing through the resonator. Thus, the precession frequency corresponding to a generated microwave changes as the amplitude and period of the precession motion change. The precession frequency is inversely proportional to a flowing current. Accordingly, the precession frequency can be increased to a high frequency by decreasing a current flowing through the resonator.

Also, the resonator illustrated in FIG. 1 is characterized in that the precession frequency of the ferromagnetic free layer 106 is adjusted according to a change in the area of the resonator. The precession frequency is proportional to the area of the resonator. Accordingly, the precession frequency can be increased to a high frequency by increasing the area of the resonator.

Band-pass filters configured using the resonator will now be described in detail.

Figure 5A:
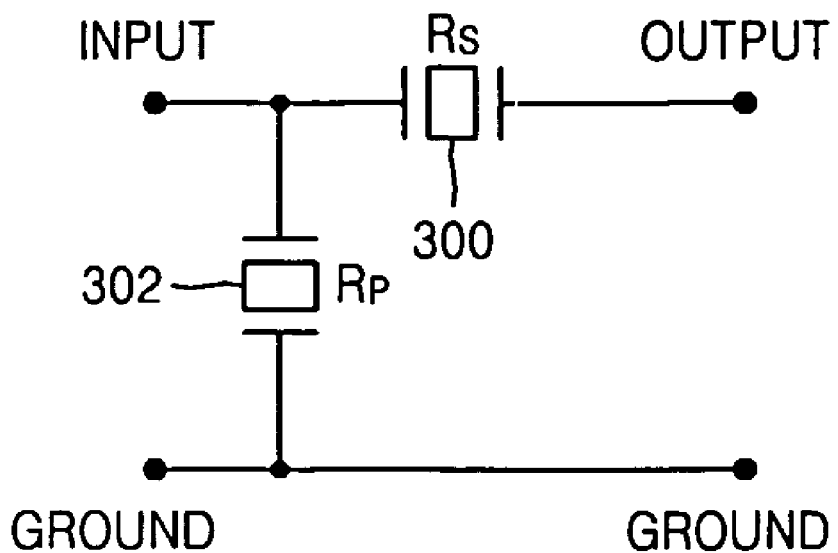
FIGS. 5A and 5B illustrate examples of band-pass filters configured using the resonator of FIG. 1 according to an exemplary embodiment of the present invention.
Figure 5B:
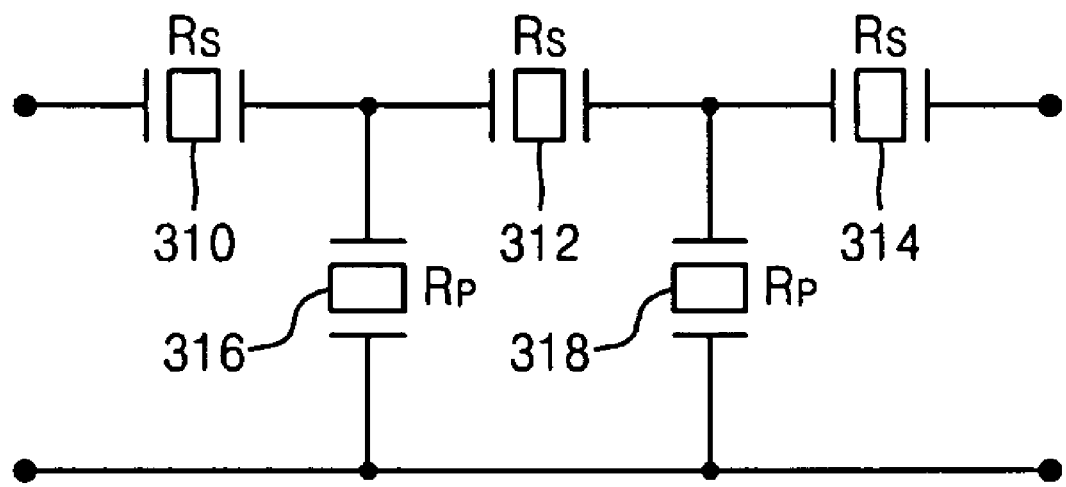

FIGS. 5A and 5B illustrates examples of band-pass filters configured using the resonator of FIG. 1, according to an exemplary embodiment of the present invention. FIG. 5A illustrates a band-pass filter including one series resonator 300 and one parallel resonator 302. FIG. 5B illustrates a band-pass filter including three serial resonators 310, 312 and 314 and two parallel resonators 316 and 318. The band-pass filters of FIGS. 5A and 5B are mere examples. That is, the band-pass filter of the present invention may be implemented in a variety of ladder structures.

A band-pass filter is a device that is configured to accurately select only a desired frequency band in a frequency-division mobile communication terminal. A band-pass filter of a receiving side must accurately select only a desired frequency among many frequencies. Likewise, a band-pass filter of a transmitting side must select only a desired transmission frequency so that signals of unnecessary frequencies are not transmitted.

Figure 6A:
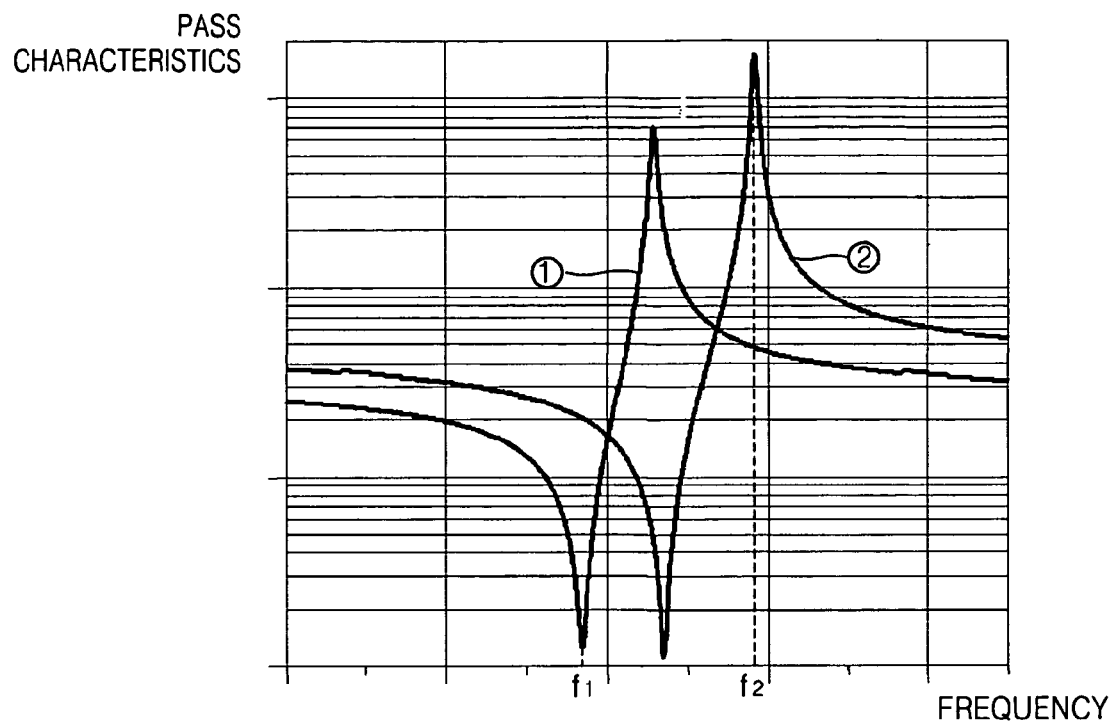
FIGS. 6A and 6B illustrate a precession frequency band created by the band-pass filters of FIGS. 5A and 5B according to an exemplary embodiment of the present invention.
Figure 6B:
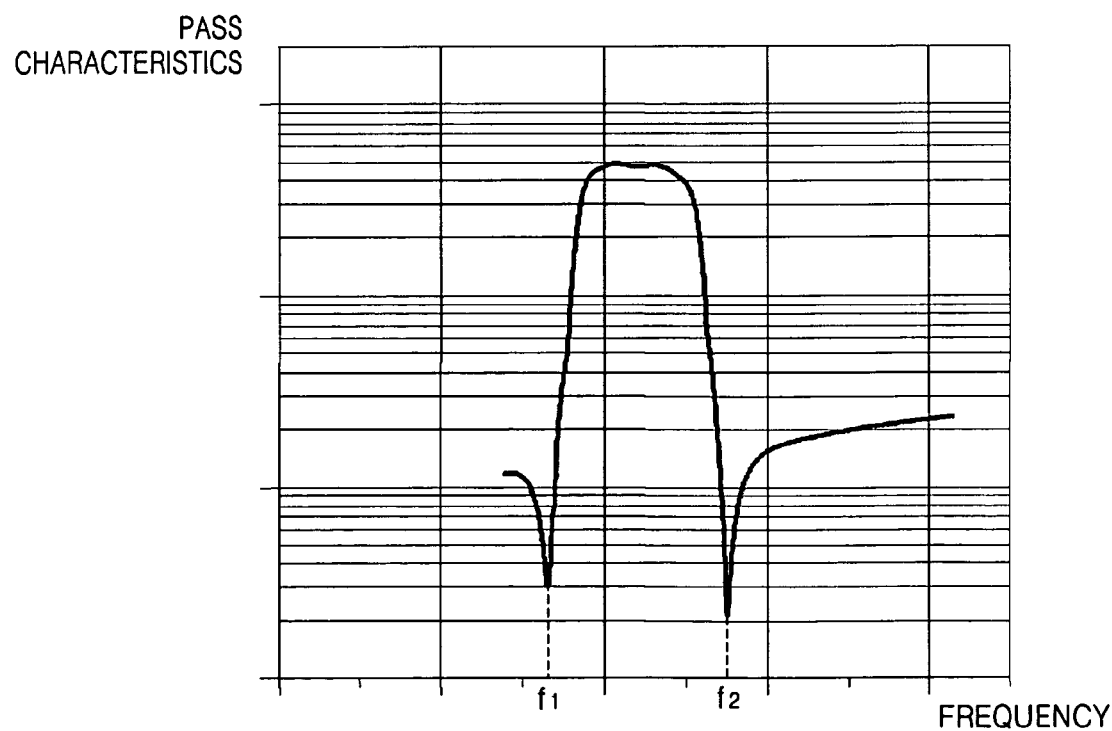

FIGS. 6A and 6B illustrate a precession frequency band created by the band-pass filter of FIGS. 5A and 5B.

FIG. 6A illustrates a graph of the relationship between a frequency and an impedance of the parallel resonators of FIGS. 5A and 5B, and a graph of the relationship between a frequency and an impedance of the series resonators of FIGS. 5A and 5B. FIG. 6B illustrates a precession frequency band obtained from the graphs and In the band-pass filters of the exemplary embodiments of the present invention, a precession frequency band of the ferromagnetic free layer is adjusted according to a change in a current vertically penetrating the series and parallel resonators. Since a frequency becomes higher as the current penetrating the resonators decreases, the precession frequency band created by the band-pass filter moves toward a high frequency direction.

Figure 7:
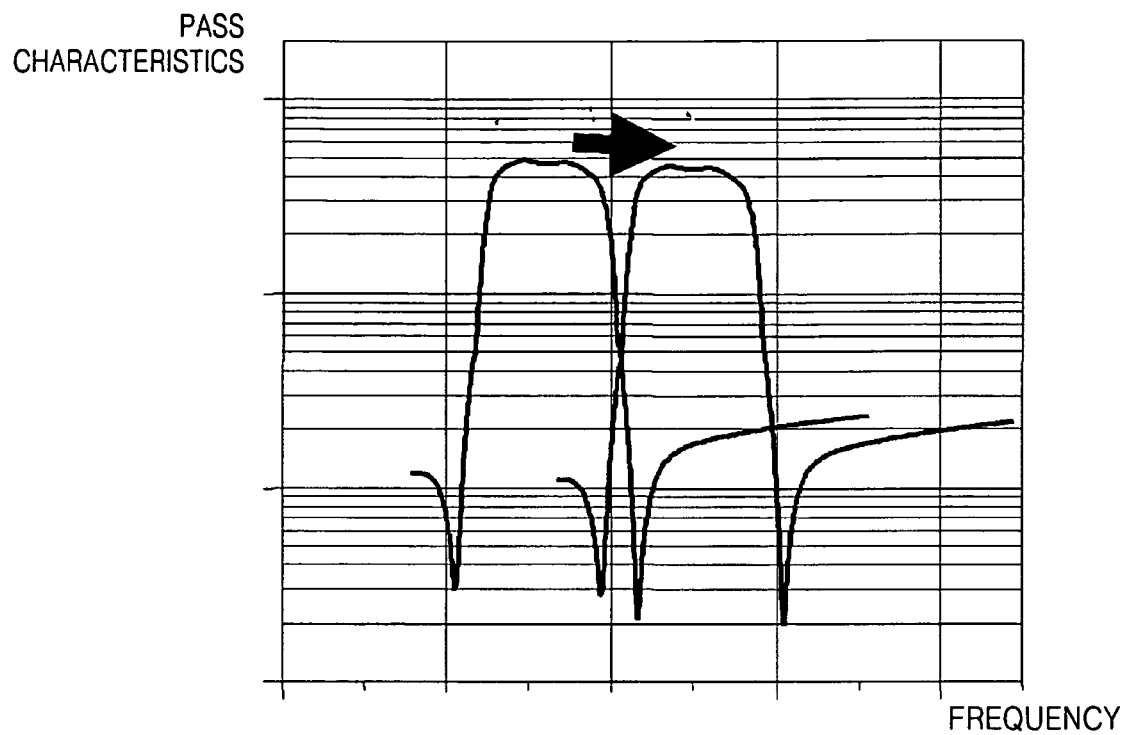
FIG. 7 illustrates that a low-frequency band moves toward a high-frequency direction when a current applied to a band-pass filer is decreased, according to an exemplary embodiment of the present invention.

FIG. 7 illustrates that a low-frequency band moves toward a high-frequency direction when a current applied to a band-pass filer is decreased. As illustrated in FIG. 7, a current flowing through the resonator is reduced in order to increase the precession frequency band created by the band-pass filter.

Also, the precession frequency band of the ferromagnetic free layer is adjusted according to a change in the area of the resonator in the band-pass filter. Since the precession frequency becomes higher as the area of the resonator increases, the precession frequency band created by the band-pass filter moves toward a high frequency direction.

Figure 8:
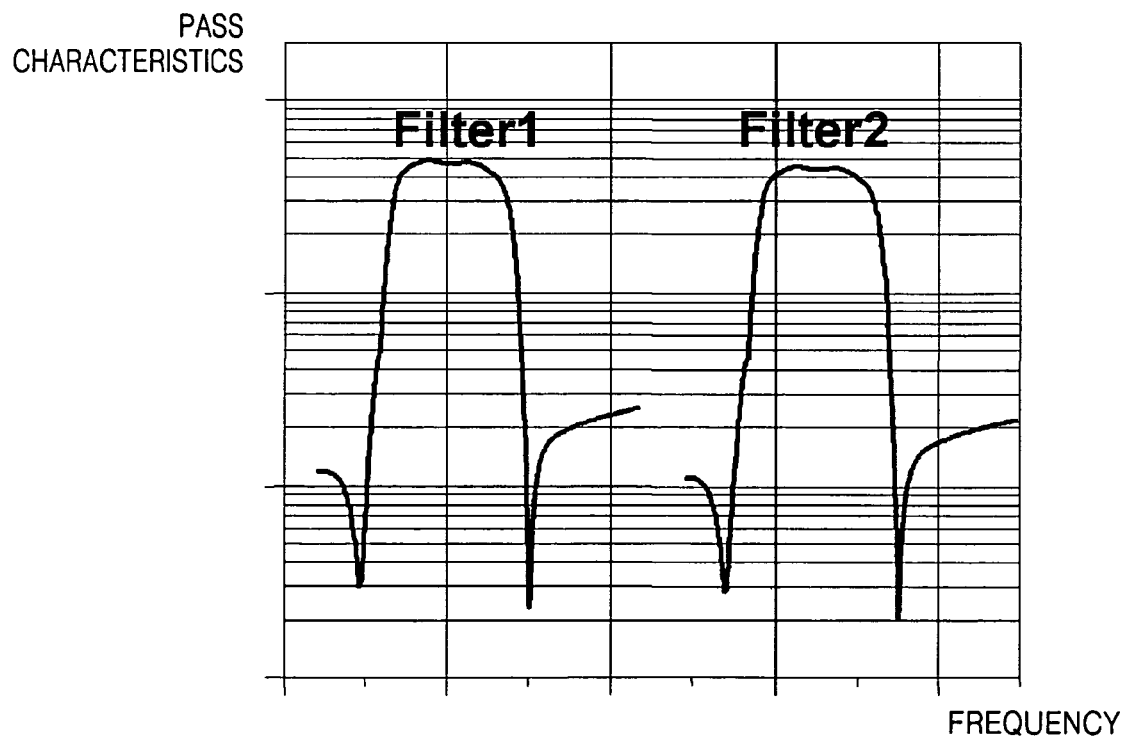
FIG. 8 illustrates precession frequency bands of two band-pass filters whose respective resonators have different areas according to an exemplary embodiment of the present invention.

FIG. 8 illustrates precession frequency bands of two band-pass filters whose respective resonators have different areas. As can be seen from FIG. 8, when the area of a resonator in a band-pass filter 1 is smaller than that of a resonator in a band-pass filter 2, the precession frequency band of the band-pass filter 2 is higher than the precession frequency band of the band-pass filter 1.

The bandwidth of the band-pass filter can be adjusted by differently adjusting the damping constants of the series and parallel resonators in the band-pass filter.

Referring to FIG. 5A, the bandwidth of the band-pass filter can be increased by adjusting the damping adjustment material of the series resonator 300 or the damping adjustment material of the parallel resonator 302 such that the series resonator 300 has a larger damping constant than the parallel resonator 302. The damping constant of the series resonator 300 may be adjusted by adding a damping adjustment material into the ferromagnetic fixed layer or the ferromagnetic free layer of the series resonator 300. Likewise, the damping constant of the parallel resonator 302 may be adjusted by adding a damping adjustment material into the ferromagnetic fixed layer or the ferromagnetic free layer of the parallel resonator 302.

Referring to FIG. 5B), the bandwidth of the band-pass filter can be increased by adjusting the damping adjustment material of the series resonators 310, 312, and 314 or the damping adjustment material of the parallel resonators 316 and 318 such that the series resonators 310, 312, and 314 have a larger damping constant than the parallel resonators 316 and 318.

Figure 9:
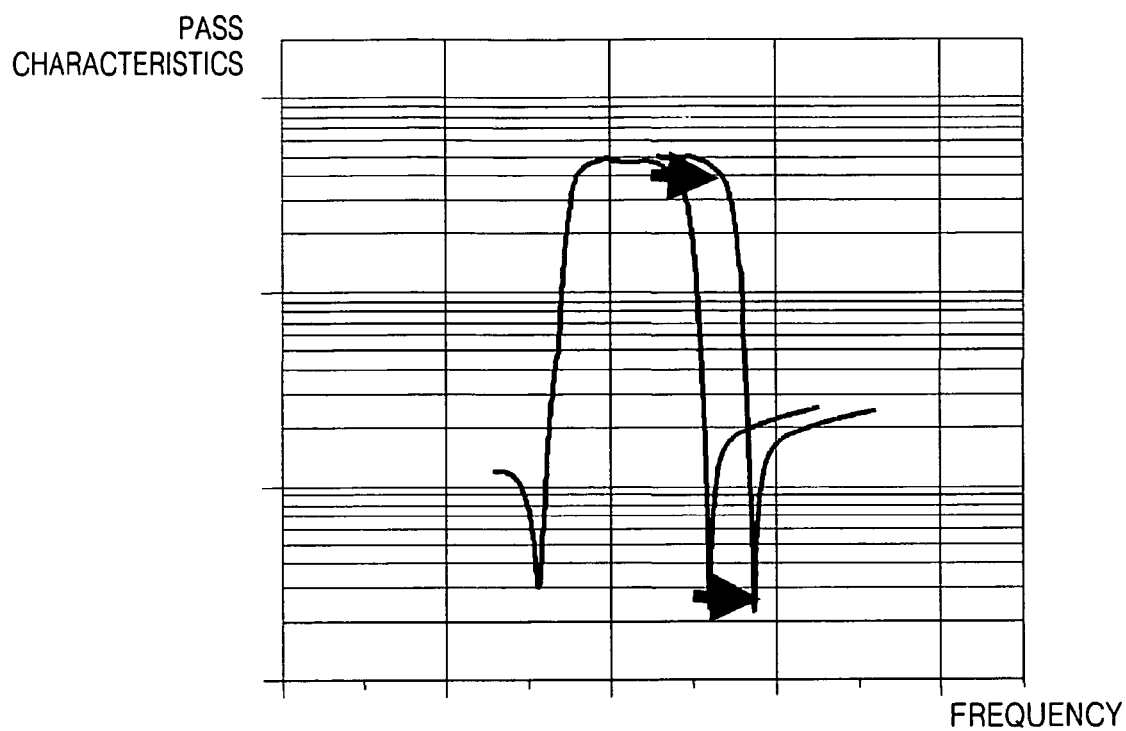
FIG. 9 illustrates that a precession frequency bandwidth increases with the difference between the damping constants of serial and parallel resonators in the band-pass filter according to an exemplary embodiment of the present invention.

FIG. 9 illustrates that a precession frequency bandwidth increases with the difference between the damping constants of the serial and parallel resonators in the band-pass filter. Referring to FIG. 9, when a damping adjustment material is added such that the series resonator has a larger damping constant than the parallel resonator, the pole of the serial resonator moves to the right side and thus the precession frequency bandwidth increases.

On the other hand, when a damping adjustment material is added such that the series resonator has a smaller damping constant than the parallel resonator, the pole of the series resonator moves to the left side and thus the precession frequency bandwidth decreases.

To make the parallel resonator have a greater polarization factor than the series resonator, the bandwidth of the band-pass filter can be adjusted by adjusting the composition ratio of the parallel resonator and the composition ratio of the series resonator.

The bandwidth of the precession frequency can be adjusted by adjusting the composition ratio of the parallel resonator and the composition ratio of the serial resonator so that the parallel resonator should have a greater polarization factor than the serial resonator.

Figure 10:
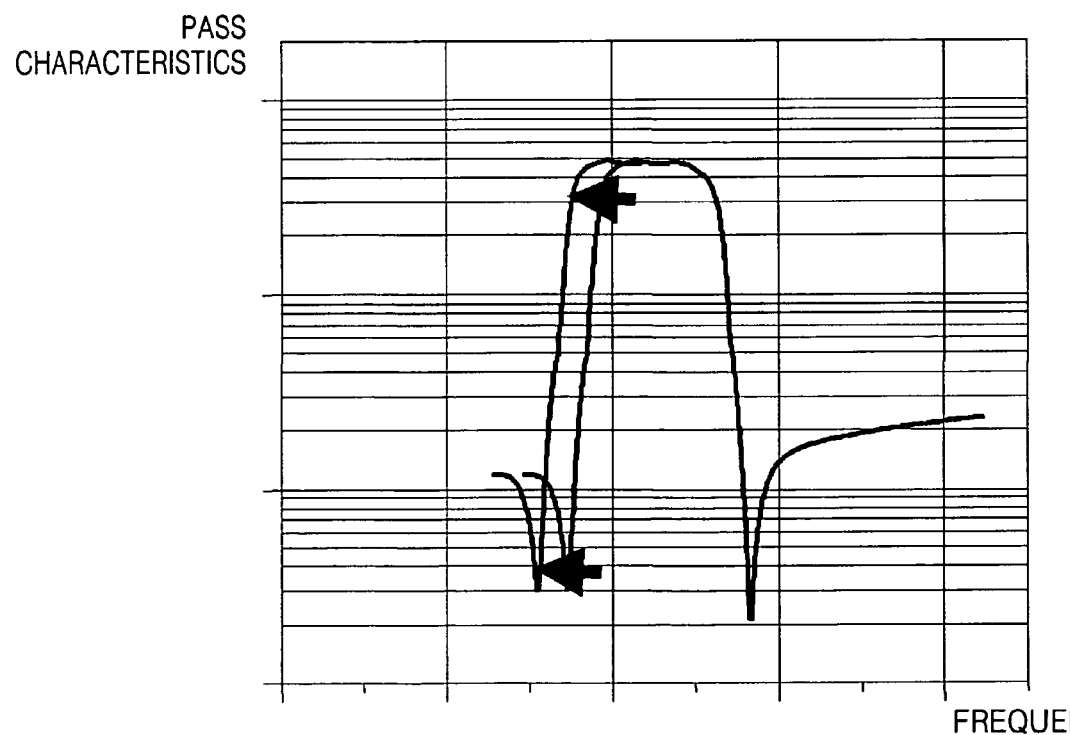
FIG. 10 illustrates that a precession frequency bandwidth increases with the difference between the polarization factors of the serial and parallel resonators in the band-pass filter according to an exemplary embodiment of the present invention.

FIG. 10 illustrates that a precession frequency bandwidth increases with the difference between the polarization factors of the series and parallel resonators in the band-pass filter.

Referring to FIG. 10, when the composition ratios of the parallel and series resonators are adjusted such that the parallel resonator has a greater polarization factor than the series resonator, the pole of the parallel resonator moves to the left side and thus the precession frequency bandwidth increases.

On the other hand, when the composition ratios of the parallel and series resonators are adjusted such that the parallel resonator has a smaller polarization factor than the series resonator, the pole of the parallel resonator moves to the right side and thus the precession frequency bandwidth decreases.

Meanwhile, the band-pass filter of the present invention is characterized in that it is installed in a package coated with a permanent magnet.

Figure 11A:
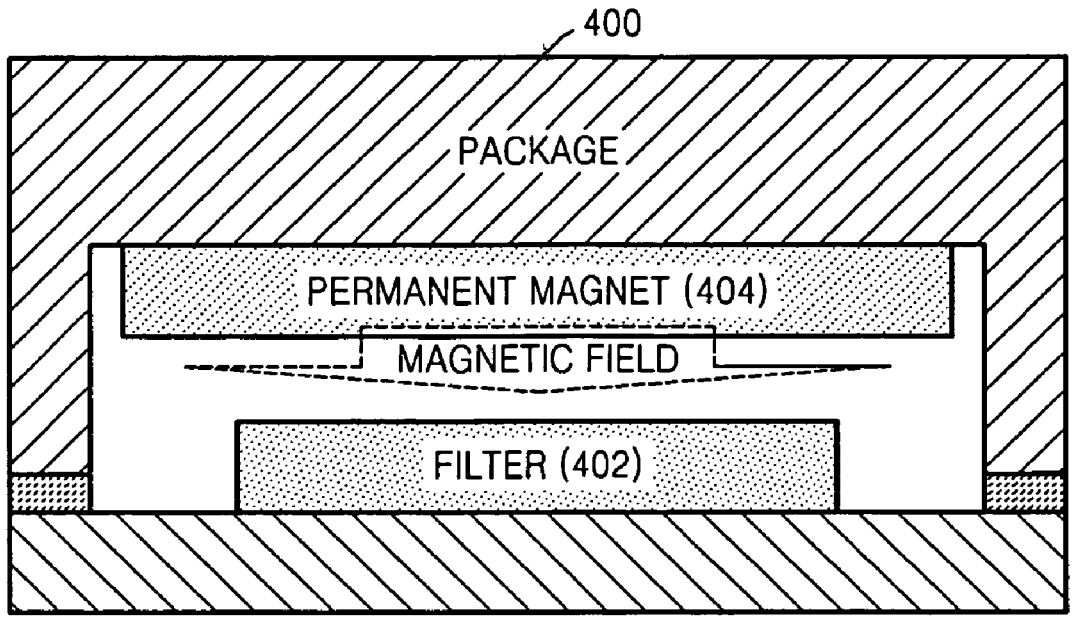
FIGS. 11A and 11B illustrate examples of a package in which the band-pass filter is installed according to an exemplary embodiment of the present invention.
Figure 11B:
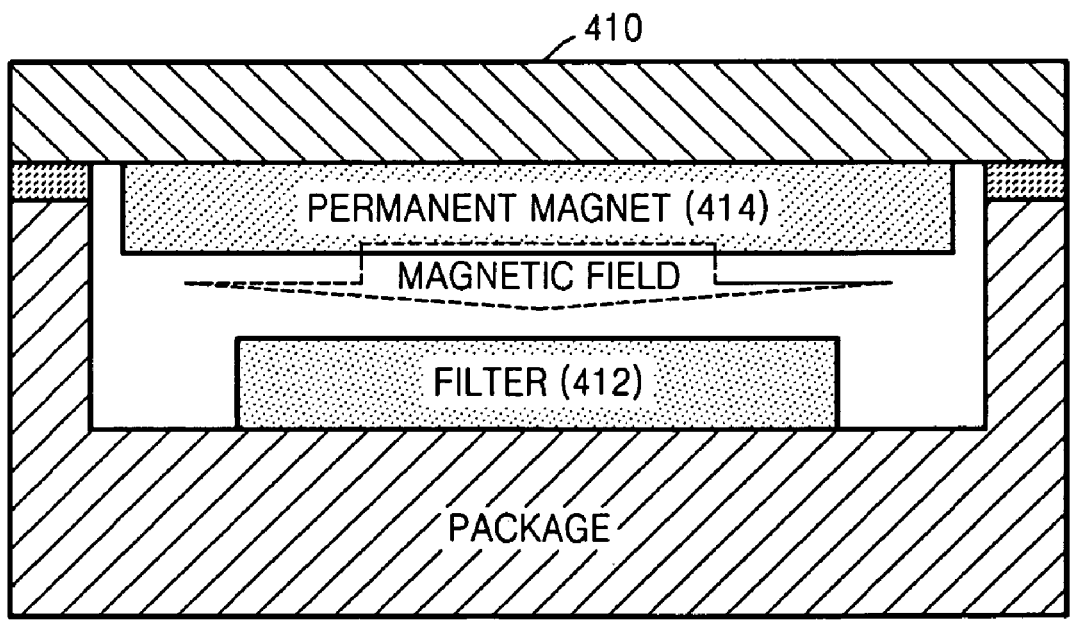

FIGS. 11A and 11B illustrate examples of a package in which a band-pass filter is installed, according to an exemplary embodiment of the present invention. Referring to FIGS. 11A and 11B, a band-pass filter 402 and a band-pass filter 412 are installed in a package 400 and a package 410, respectively.

The packages 400 and 410 are coated with a permanent magnet 404 and a permanent magnet 414, respectively. A precession frequency band may be adjusted by adjusting the strengths of magnetic fields of the permanent magnets 404 and 414. The magnetic field of the permanent magnet may be adjusted in the range of 0 to 10000 [Oersted].

The packages 400 and 410 are formed of a ceramic material or a metallic material.

A duplexer including the band-pass filter of the present invention will now be described in detail.

Figure 12:
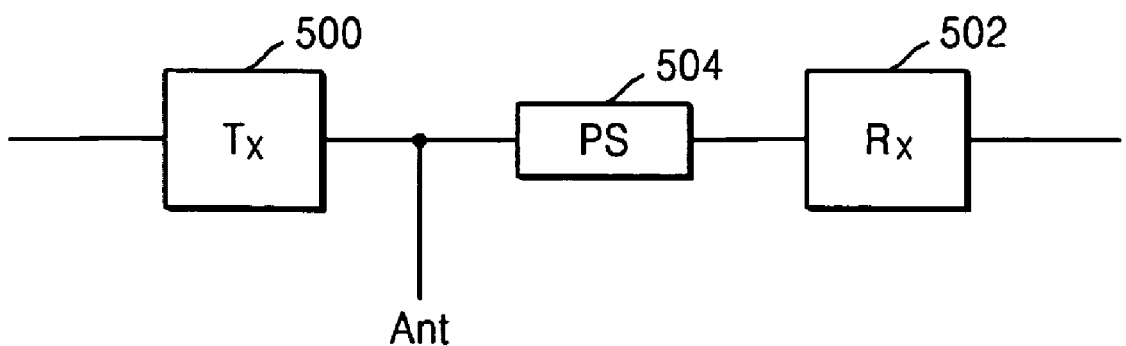
FIG. 12 illustrates an example of a duplexer including a plurality of band-pass filters illustrated in FIGS. 5A and 5B according to an exemplary embodiment of the present invention.

FIG. 12 illustrates an example of a duplexer including a plurality of band-pass filters illustrated in FIGS. 5A and 5B.

Referring to FIG. 12, the duplexer includes a first band-pass filter 500, a second band-pass filter 502, and a phase shifter 504.

A duplexer is used for separating a transmission signal from a reception signal in a Code Division Multiple Access (CDMA) communication system. When the transmitting and receiving sides use different antennas, no duplexer is required. In the case of a small-sized system such as a mobile communication terminal, the transmitting and receiving sides must share the same antenna. In this case, a duplexer is required for efficiently sharing the antenna.

The first and second band-pass filters 500 and 502 include the resonator of FIG. 1.

In the first band-pass filter 500, a precession frequency band of a ferromagnetic free layer is adjusted according to a change in a current vertically penetrating the resonator. When the current penetrating the resonator decreases, a frequency becomes higher and thus a precession frequency band created by the band-pass filer moves toward a high frequency direction.

As illustrated in FIG. 7, a current applied to the resonator of the first band filter 500 may be decreased in order to move the precession frequency band toward a high frequency direction.

In the first band-pass filter 500, the precession frequency band of the ferromagnetic free layer is adjusted according to a change in the area of the resonator. When the area of the resonator increases, a precession frequency becomes higher and thus the precession frequency created by the band-pass filter moves toward a high frequency direction.

As illustrated in FIG. 8, when the area of the resonator in the band-pass filter 1 is smaller than that of the resonator in the band-pass filter 2, the precession frequency band of the band-pass filter 2 is higher than that of the band-pass filter 1.

In the first band-pass filter 500, the bandwidth can be increased by adjusting the damping adjustment materials of the series and parallel resonators such that the series resonator has a larger damping constant than the parallel resonator.

As illustrated in FIG. 9, when a damping adjustment material is added such that the series resonator has a larger damping constant than the parallel resonator, the pole of the series resonator moves to the right side, and thus the precession frequency bandwidth increases.

On the other hand, when a damping adjustment material is added such that the series resonator has a smaller damping constant than the parallel resonator, the pole of the series resonator moves to the left side, and thus the precession frequency bandwidth decreases.

In the first band-pass filter 500, the bandwidth can be increased by adjusting the composition ratios of the series and parallel resonators such that the parallel resonator has a greater polarization factor than the series resonator.

As illustrated in FIG. 10, when the composition ratios of the parallel and series resonators are adjusted such that the parallel resonator has a greater polarization factor than the series resonator, the pole of the parallel resonator moves to the left side, and thus the precession frequency bandwidth increases.

On the other hand, when the composition ratios of the parallel and series resonators are adjusted such that the parallel resonator has a smaller polarization factor than the series resonator, the pole of the parallel resonator moves to the right side, and thus the precession frequency bandwidth decreases.

In the second band-pass filter 502, the precession frequency band of the ferromagnetic free layer is adjusted according to a change in a current vertically penetrating the resonator. Since a frequency becomes higher as the current penetrating the resonator decreases, the precession frequency band created by the band-pass filter moves toward a high-frequency direction.

In the second band-pass filter 502, the precession frequency band of the ferromagnetic free layer is adjusted according to a change in the area of the resonator. When the area of the resonator increases, a precession frequency becomes higher, and thus the precession frequency created by the band-pass filter moves toward a high-frequency direction.

In the second band-pass filter 502, the bandwidth can be increased by adjusting the damping adjustment materials of the series and parallel resonators such that the series resonator has a larger damping constant than the parallel resonator.

On the other hand, when a damping adjustment material is added such that the series resonator has a smaller damping constant than the parallel resonator, the pole of the series resonator moves to the left side, and thus the precession frequency bandwidth decreases.

In the second band-pass filter 502, the bandwidth can be increased by adjusting the composition ratios of the parallel and series resonators so that the parallel resonator has a greater polarization factor than the series resonator.

On the other hand, when the composition ratios of the parallel and series resonators are adjusted such that the parallel resonator has a smaller polarization factor than the series resonator, the pole of the parallel resonator moves to the right side, and thus the precession frequency bandwidth decreases.

The phase shifter 504 shifts the phase of a signal such that transmission and reception signals are not mixed with each other.

The duplexer of the present invention is installed in the package coated with the permanent magnet.

Figure 13A:
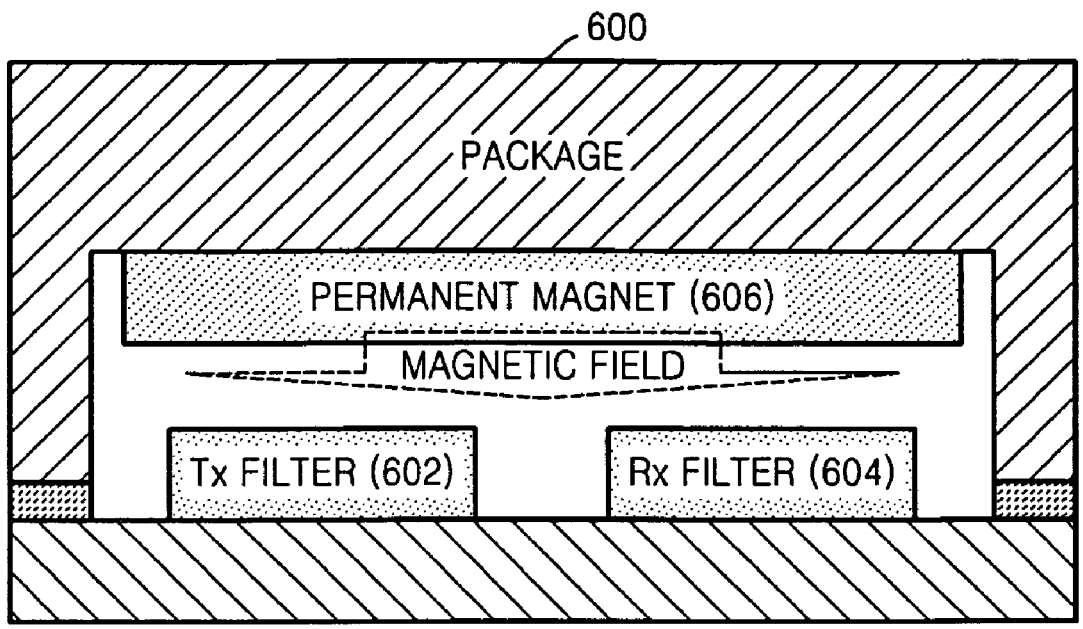
FIGS. 13A and 13B illustrate examples of a package in which a band-pass filter is installed according to an exemplary embodiment of the present invention.
Figure 13B:
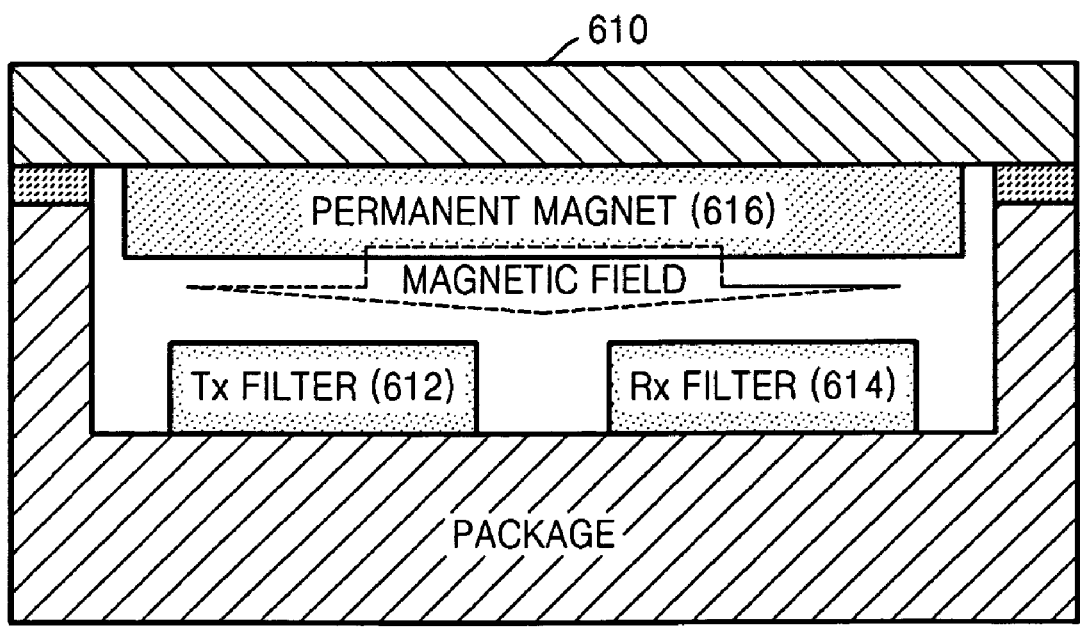

FIGS. 13A and 13B illustrate examples of a package in which band-pass filters are installed, according to an exemplary embodiment of the present invention.

Referring to FIG. 13A, first and second band-pass filters 602 and 604 are installed in a package 600. Referring to FIG. 13B, first and second band-pass filters 612 and 614 are installed in a package 610.

The packages 600 and 610 are coated with a permanent magnet 606 and a permanent magnet 616, respectively. A precession frequency band may be adjusted by adjusting the strengths of magnetic fields of the permanent magnets 606 and 616. The magnetic field of the permanent magnet may be adjusted in the range of 0 to 10000 [Oersted].

The packages 600 and 610 are formed of a ceramic material or a metallic material.

As described above, the resonator can be used to implement the band-pass filter and the duplexer that can be used in a high-frequency range of 40 GHz or more.

Also, the band-pass filter and the duplexer can be miniaturized to implement a lighter and smaller mobile communication device.

Also, the band-pass filter and the duplexer enable the precession frequency bandwidth to be adjusted.

Also, the band-pass filter or the duplexer is installed in the ceramic or metallic package and thus can be modularized with an integrated circuit.

Also, the phase shifter can be installed in the ceramic or metallic package. While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A resonator comprising:
    a first electrode comprising a nonmagnetic conductive material;
    a ferromagnetic fixed layer disposed on the first electrode, the ferromagnetic fixed layer having a fixed magnetization direction;
    a nonmagnetic conductive layer disposed on the ferromagnetic fixed layer;
    a ferromagnetic free layer disposed on the nonmagnetic conductive layer, the ferromagnetic free layer having a magnetization direction which varies with an external magnetic field; and
    a second electrode disposed on the ferromagnetic free layer, the second electrode comprising a nonmagnetic conductive material.

2. The resonator of claim 1, wherein the ferromagnetic fixed layer comprises:
    a magnetization rotation suppressing layer disposed on the first electrode to suppress magnetization rotation; and
    a ferromagnetic layer disposed on the magnetization rotation suppressing layer, the magnetization direction of the ferromagnetic layer being fixed by the magnetization rotation suppressing layer.

3. The resonator of claim 2, wherein the magnetization rotation suppressing layer comprises at least two of platinum (Pt), manganese (Mn), iridium (Ir), iron (Fe), and nickel (Ni).

4. The resonator of claim 2, wherein the ferromagnetic layer comprises at least one of iron (Fe), cobalt (Co), and nickel (Ni).

5. The resonator of claim 2, wherein the ferromagnetic layer comprises at least two of iron (Fe), cobalt (Co), and nickel (Ni).

6. The resonator of claim 2, wherein a composition ratio of the ferromagnetic layer is adjusted to change a polarization factor.

7. The resonator of claim 2, wherein the ferromagnetic layer comprises a damping adjustment material which adjusts a damping constant for a precession motion of the ferromagnetic free layer.

8. The resonator of claim 7, wherein the ferromagnetic layer comprises at least one of osmium (Os), niobium (Nb), ruthenium (Ru), rhodium (Rh), tantalum (Ta), and platinum (Pt) as the damping adjustment material.

9. The resonator of claim 1, wherein the nonmagnetic conductive layer comprises at least one of gold (Au), silver (Ag), copper (Cu), aluminum (Al), platinum (Pt), tungsten (W), ruthenium (Ru), chromium (Cr), molybdenum (Mo), rhodium (Ro), tantalum (Ta) and titanium (Ti).

10. The resonator of claim 1, wherein the nonmagnetic conductive layer comprises at least two of gold (Au), silver (Ag), copper (Cu), aluminum (Al), platinum (Pt), tungsten (W), ruthenium (Ru), chromium (Cr), molybdenum (Mo), rhodium (Ro), tantalum (Ta), and titanium (Ti).

11. The resonator of claim 1, wherein at least one of the ferromagnetic fixed layer and the ferromagnetic free layer comprises at least one of iron (Fe), cobalt (Co) and nickel (Ni).

12. The resonator of claim 1, wherein at least one of the ferromagnetic fixed layer and the ferromagnetic free layer comprises at least two of iron (Fe), cobalt (Co), and nickel (Ni).

13. The resonator of claim 1, wherein a composition ratio of at least one of the ferromagnetic fixed layer and the ferromagnetic free layer is adjusted to change a polarization factor.

14. The resonator of claim 1, wherein at least one of the ferromagnetic fixed layer and the ferromagnetic free layer comprises a damping adjustment material which adjusts a damping constant for a precession motion of the ferromagnetic free layer.

15. The resonator of claim 14, wherein at least one of the ferromagnetic fixed layer and the ferromagnetic free layer comprises at least one of osmium (Os), niobium (Nb), ruthenium (Ru), rhodium (Rh), tantalum (Ta), and platinum (Pt) as the damping adjustment material.

16. The resonator of claim 1, wherein a precession frequency of the ferromagnetic free layer is adjusted according to a change in a current vertically penetrating the resonator.

17. The resonator of claim 1, wherein a precession frequency of the ferromagnetic free layer is adjusted according to a change in an area of the resonator.

18. A band-pass filter comprising at least two resonators, wherein the at least two resonators comprise at least one serial resonator and at least one parallel resonator, and wherein each of the at least two resonators comprising:
a first electrode comprising a nonmagnetic conductive material;
a ferromagnetic fixed layer disposed on the first electrode, the ferromagnetic fixed layer having a fixed magnetization direction;
a nonmagnetic conductive layer disposed on the ferromagnetic fixed layer;
a ferromagnetic free layer disposed on the nonmagnetic conductive layer, the ferromagnetic free layer having a magnetization direction which varies with an external magnetic field; and
a second electrode disposed on the ferromagnetic free layer, the second electrode comprising a nonmagnetic conductive material.

19. The band-pass filter of claim 18, wherein a precession frequency band of the ferromagnetic free layer is adjusted according to a change in a current vertically penetrating each of the at least two resonators.

20. The band-pass filter of claim 18, wherein a precession frequency band of the ferromagnetic free layer is adjusted according to a change in an area of each of the at least two resonators.

21. The band-pass filter of claim 18, wherein at least one of the ferromagnetic fixed layer and the ferromagnetic free layer comprises a damping adjustment material which adjusts a damping constant for a precession motion of the ferromagnetic free layer.

22. The band-pass filter of claim 21, wherein the damping adjustment material is adjusted to adjust a bandwidth of the band-pass filter.

23. The band-pass filter of claim 22, wherein the damping adjustment material is adjusted such that a damping constant of the at least one serial resonator is greater than a damping constant of the at least one parallel resonator, in order to increase the bandwidth of the band-pass filter.

24. The band-pass filter of claim 18, wherein a composition ratio of at least one of the at least one serial resonator and the at least one parallel resonator is adjusted to adjust a polarization factor in order to adjust a bandwidth of the band-pass filter.

25. The band-pass filter of claim 24, wherein the composition ratio is adjusted such that the polarization factor of the at least one parallel resonator is greater than the polarization factor of the at least one serial resonator, in order to increase the bandwidth of the band-pass filter.

26. The band-pass filter of claim 18, wherein the band-pass filter is installed in a package coated with a permanent magnet.

27. The band-pass filter of claim 26, wherein a strength of the magnetic field of the permanent magnet is adjustable.

28. The band-pass filter of claim 26, wherein the package comprises a ceramic material or a metallic material.

29. A duplexer comprising:
first and second band-pass filters, each band-pass filter comprising at least two resonators; and
a phase shifter,
wherein the at least two resonators comprise at least one serial resonator and at least one parallel resonator, and
wherein each of the at least two resonators comprising:
a first electrode comprising a nonmagnetic conductive material;
a ferromagnetic fixed layer disposed on the first electrode, the ferromagnetic fixed layer having a fixed magnetization direction;
a nonmagnetic conductive layer disposed on the ferromagnetic fixed layer;
a ferromagnetic free layer disposed on the nonmagnetic conductive layer, the ferromagnetic free layer having a magnetization direction which varies with an external magnetic field; and
a second electrode disposed on the ferromagnetic free layer, the second electrode comprising a nonmagnetic conductive material.

30. The duplexer of claim 29, wherein a precession frequency band of the ferromagnetic free layer in at least one of the first and second band-pass filters is adjusted according to a change in a current vertically penetrating each of the at least two resonators.

31. The duplexer of claim 29, wherein a precession frequency band of the ferromagnetic free layer in at least one of the first and second band-pass filters is adjusted according to a change in an area of each of the at least two resonators.

32. The duplexer of claim 29, wherein at least one of the ferromagnetic fixed layer and the ferromagnetic free layer in at least one of the first and second band-pass filters comprises a damping adjustment material which adjusts a damping constant for a precession motion of the ferromagnetic free layer.

33. The duplexer of claim 32, wherein the damping adjustment material is adjusted to adjust a bandwidth of at least one of the first and second band-pass filters.

34. The duplexer of claim 33, wherein the damping adjustment material is adjusted such that a damping constant of the at least one serial resonator is greater than a damping constant of the at least one parallel resonator, in order to increase the bandwidth of the at least one of the first or second band-pass filters.

35. The duplexer of claim 29, wherein a composition ratio of at least one of the at least one serial resonator and the at least one parallel resonator in at least one of the first and second band-pass filters is adjusted to adjust a polarization factor in order to adjust a bandwidth of the at least one of the first and second band-pass filters.

36. The duplexer of claim 35, wherein the composition ratio is adjusted such that the polarization factor of the at least one parallel resonator is greater than the polarization factor of the at least one serial resonator, in order to increase the bandwidth of the at least one of the first and second band-pass filters.

37. The duplexer of claim 26, wherein the duplexer is installed in a package coated with a permanent magnet.

38. The duplexer of claim 37, wherein a strength of the magnetic field of the permanent magnet is adjustable.

39. The duplexer of claim 37, wherein the package comprises a ceramic material or a metallic material.

* * * * *